(United States Patent [19])

Baldvins et al.

[11] Patent Number: 4,504,565
[45] Date of Patent: Mar. 12, 1985

[54] RADIATION IMAGEABLE COMPOSITIONS CONTAINING HOLLOW CERAMIC MICROSPHERES

[75] Inventors: Jon O. Baldvins; Joseph Puleo, Jr., both of Marlborough, N.H.

[73] Assignee: Markem Corporation, Keene, N.H.

[21] Appl. No.: 601,217

[22] Filed: Apr. 17, 1984

[51] Int. Cl.³ .......................... G03G 5/00; G03G 5/04
[52] U.S. Cl. .................................. 430/138; 346/76 L; 430/290; 430/346; 430/935; 430/945; 430/964
[58] Field of Search ............... 430/138, 935, 346, 945, 430/964, 290; 346/76 L

[56] References Cited

· U.S. PATENT DOCUMENTS

| | | | |
|---|---|---|---|
| 3,257,265 | 6/1966 | Isenberg | 428/304.4 |
| 3,407,165 | 10/1968 | Oepkes et al. | 533/219 |
| 3,907,566 | 9/1975 | Inoue et al. | 430/346 |
| 3,975,304 | 8/1976 | della Porta et al. | 502/246 |
| 4,101,501 | 7/1978 | Hinterwaldner | 523/205 |
| 4,115,256 | 9/1978 | de Zeeuw | 209/3 |
| 4,173,475 | 11/1979 | Chandross et al. | 430/290 |
| 4,187,111 | 2/1980 | Chandross et al. | 430/290 |
| 4,195,312 | 3/1980 | Bell et al. | 346/76 L |
| 4,195,313 | 3/1980 | Bell et al. | 346/76 L |
| 4,273,806 | 6/1981 | Stechler | 427/119 |
| 4,305,985 | 12/1981 | Heublein | 428/87 |
| 4,329,617 | 5/1982 | Bell | 346/76 L |
| 4,330,634 | 5/1982 | Rodaway | 521/65 |
| 4,351,913 | 9/1982 | Patel | 521/140 |
| 4,362,566 | 12/1982 | Hinterwaldner | 106/85 |
| 4,382,821 | 5/1983 | Davis et al. | 106/272 |

OTHER PUBLICATIONS

Zeeospheres ® technical data sheet, Zeelan Industries Inc., St. Paul, Minnesota, (undated).
4,053,448 10001977 Holle 523 219

Primary Examiner—John E. Kittle
Assistant Examiner—Mukund J. Shah
Attorney, Agent, or Firm—Robbins & Laramie

[57] ABSTRACT

A radiation imageable composition in which an image can be produced upon exposure to intense radiation is disclosed which comprises (a) hollow, ceramic microspheres, and (b) a binder material which will not be destroyed during exposure of the composition to intense radiation and will not mask the image produced upon exposure to intense radiation, wherein the binder material has an index of refraction greater than the index of refraction of the microspheres in the absence of any other dye or pigment.

65 Claims, No Drawings

RADIATION IMAGEABLE COMPOSITIONS CONTAINING HOLLOW CERAMIC MICROSPHERES

BACKGROUND OF THE INVENTION

1. Field of the Invention

This invention relates to a composition containing hollow ceramic microspheres upon which an image can be produced by subjecting the surface thereof to a source of intense radiation, and to the process for producing an image thereon.

2. Description of the Prior Art

Prior to the present invention, a number of techniques were suggested for producing materials that could be imaged upon being subjected to a source of intense radiation, such as a laser.

In the majority of the prior art techniques, the substrate is coated with a layer of a composition containing a material that absorbs the radiant energy and becomes vaporized or is otherwise removed from the surface of the substrate. Examples of radiant energy absorbing materials include various dyes and pigments, such as carbon black, and various metals, such as aluminum. If a metallic layer is coated over a dark substrate, for example, selective removal of the metallic layer will produce a positive image. If, however, a dark pigmented layer is coated over a transparent or light substrate, selective removal of the dark layer will result in a negative image.

These techniques have been employed by manufacturers of electronic components in connection with their laser marking systems. Electronic components, such as dual inline packages (DIPs), are first coated with a laser-imageable coating using conventional printing techniques such as silk screen, spraying and offset lithographic. The coated components are then selectively subjected to laser radiation which removes the coating from the areas exposed to produce an image, such as a part number or other form of identification. After printing, many electronic components are cleaned, for example in an HCl bath. Coatings containing metallic particles are attacked by the HCl to a sufficient degree to cause severe contamination of the bath and destruction of the coating.

One of the major drawbacks of the laser-imageable coating compositions that have been used is the difficulty associated with matching the color of the coating to the color of the potting compound for the electronic component. Different manufacturers prefer to distinguish their products using different colors. If the laser-imageable coating were metallic, it would have to be coated over a dark colored surface to provide the necessary contrast to the areas in which the coating had been removed by the laser. If, on the other hand, a pigment such as carbon black were to be employed in the coating, there would not be sufficient contrast against the dark background of the potting compound.

Other laser-imageable compositions are prepared with iron oxide yellow as the pigment material. Upon exposure to laser radiation, the areas exposed turn red in color due to the formation of iron oxide red.

What would be most desirable from the standpoint of color contrast, therefore, would be a coating containing a pigment or other material which changed to a color upon exposure to radiation that was in contrast with the original color of the coating. Even if such coatings were developed, however, the original colors would still have to be matched to the color of the substrate. Thus, a number of different colors which matched the colors of the substrates and which also changed to a contrasting color upon exposure to laser radiation would have to be developed.

Many of the problems associated with these laser-imageable coating compositions had been overcome by preparing radiation-imageable compositions comprising either clay or barium sulfate or a mixture thereof with a binder material. Compositions could be prepared that were essentially transparent or translucent and which turned white in color upon exposure to intense radiation. Because the coating compositions are substantially transparent, there is no longer any need to select dyes or pigments to match the color of the coating to the color of the potting compound. The white-colored image produced in the transparent coating will provide sufficient contrast against any darker color of the component over which it is coated. As a result, the manufacturer of electronic components can always maintain the desired color of the potting compound and obtain sufficient contrast between the image and the background against which it is produced.

It has been found, however, that even coating compositions containing clay and/or barium sulfate suffer from a number of drawbacks. Because the coating compositions are often highly filled with clay and/or barium sulfate, they tend to be very viscous and difficult to handle and coat onto the electronic components. Moreover, since the particles of clay and barium sulfate are generally irregular in size and shape, the surfaces of the coatings made from the compositions containing such particles are relatively rough or coarse in character and appearance. Because of this rough surface characteristic, coatings containing particles of clay and/or barium sulfate are relatively less resistant to abrasion.

SUMMARY OF THE INVENTION

In accordance with the present invention, improved, abrasion resistant, radiation imageable compositions are prepared in which images are produced upon exposure of the compositions to intense radiation. The compositions comprise hollow, ceramic microspheres in a binder material which will not be destroyed and which will not mask the image produced upon exposure to intense radiation. The binder material in the absence of any other dye or pigment has an index of refraction greater than the index of refraction of the microspheres. In addition, the radiation imageable composition is essentially transparent or translucent and the image produced upon exposure to radiation is white in color in the absence of any other dye or pigment. Preferably, the microspheres are made of a silica/alumina alloy. The binder material can comprise any natural or synthetic resin material.

The compositions of the present invention can be used in a variety of applications, such as coating compositions, molding compounds, potting compounds for encapsulating electronic components or in any other way used to render an article or a surface thereof imageable upon exposure to intense radiation.

In the process of the present invention, an article is made from or coated with the composition of the present invention so that an image can be produced in this composition upon exposure to intense radiation. The areas of the surface of the article on which images are desired are then selectively exposed to an imagewise pattern of high intensity radiation. Lasers have been found to be particularly suitable sources of intense radiation. The surface of the article should be exposed to the radiant energy in an amount and for a time sufficient to produce an image in the area irradiated. A source of radiation having an energy density of from about 1.08 to about 8.4 joules/cm² at the surface of the article has been found to be acceptable.

Because such a variety of compositions can be prepared which contain hollow, ceramic microspheres in accordance with the present invention, it has been found that many different articles or surfaces can be rendered imageable or markable with a laser or other source of high intensity radiant energy. This invention significantly increases the versatility of conventional laser marking systems, which are presently limited to the use of a few laser imageable coatings for electronic components. This invention also provides a significant improvement over similar radiation imageable compositions containing clay and/or barium sulfate. Because of the spherical shape, compositions filled with the ceramic microspheres have a much lower viscosity, and are less thixotropic and therefore, are easier to handle and apply to substrates. The compositions can be more highly filled with a lower vehicle demand. As a result, the compositions are easier and less expensive to formulate than prior compositions. Moreover, since the microspheres do not have the irregular shapes of other particulate filler materials, the coatings produced have smoother surfaces and greater abrasion resistance.

Images produced in the compositions of the present invention upon exposure to intense radiation have been found to be comparable to or brighter than those produced with similar compositions containing clay and/or barium sulfate.

DESCRIPTION OF THE PREFERRED EMBODIMENTS

In accordance with the present invention, abrasion resistant compositions are prepared in which images can be produced upon exposure to high intensity radiant energy. The compositions comprise hollow, ceramic microspheres in a binder material which is not destroyed during exposure to radiation and which does not mask the image produced upon irradiation of the composition.

As used herein, the term "ceramic" refers to a material made by the action of heat on earthy raw materials, in which the element silicon with its oxide and complex compounds known as silicates occupy a predominant position, to produce a crystalline inorganic particulate material bonded together in a mass by means of a glassy phase and/or a solid state sintering.

The compositions can contain any inert, hollow, ceramic microspheres which have an index of refraction less than the index of refraction of the binder material employed in the absence of any other dye or pigment. When hollow, ceramic microspheres are used which exhibit a lower index of refraction, the resulting compositions are essentially transparent or translucent and the images produced upon exposure of the compositions to intense radiation are white in color. If the index of refraction of the hollow, ceramic microspheres is greater than that of the binder material, then the microspheres will function as pigments to render the composition opaque upon drying or curing.

It will be appreciated that hollow, ceramic microspheres of the type which are suitable for use in the practice of the present invention are presently being manufactured specifically for use as extender pigments with a high level of hiding power. The hollow spherical shape causes light to diffuse and scatter and renders the composition containing the microspheres opaque. In contrast, the compositions of the present invention have been formulated so that the superior hiding power of the microspheres has been essentially eliminated, rendering the compositions substantially transparent or translucent. Only upon subjection to intense radiation do the exposed areas of the present compositions become opaque thereby producing images in the surfaces of the compositions.

Preferably, the hollow, ceramic microspheres employed in the compositions of the present invention are made of an inert silica-alumina ceramic material. An example of commercially available, hollow ceramic microspheres which are particularly suitable for use in the present invention are sold by Zeelan Industries, Inc. of St. Paul, Minn. under the name ZEEOSPHERES ®. These microspheres are hollow spheres with thick walls, odorless, and light gray in color. They have a strength of over 60,000 psi, a hardness on the Mohs scale of 7, a bulk weight of about 70 lbs/ft³, and are available in diameters ranging from 0.1 micron to 300 microns. Microspheres diameters ranging from about 0.1 to about 50 microns, and preferably from about 0.1 to about 25 microns, have been found to be particularly suitable in the practice of the present invention with the quality of the image produced upon exposure to intense radiation being inversely proportional to the diameters of the microspheres.

Microspheres or cenospheres suitable for use in the present invention can be obtained, for example, using the process described in U.S. Pat. No. 4,115,256 incorporated herein by reference as though set forth in full. The combustion of a solid fuel such as coal produces fine particles of non-combusted materials called fly ash. Cenospheres have been found to be a major constituent of fly ash. Fly ash cenospheres are chemically inert, hollow spheres comprised primarily of silicon oxide, aluminum oxide and iron oxide, with nitrogen in their voids.

The amount of hollow, ceramic microspheres present in the compositions of the present invention can vary widely. The upper limit is simply a function of the surface area of the microspheres used and the viscosity and rheological properties desired for the composition. The upper limit will be less than the critical pigment volume content (CPVC) of the composition. A critical pigment volume content (or concentration) is defined as that level of pigmentation (PVC value) in a dry coating where just sufficient binder is present to fill the voids between the pigment particles. PVC values are determined as follows:

$$PVC = \frac{100\rho b}{\rho b + 0.01 OA \rho p}$$

where
PVC = pigment volume content (%),
OA = oil absorption value (pounds of linseed oil per 100 pounds of pigment) expressed as a percent,
$\rho b$ = density of linseed oil binder (0.935 g/cm³), and
$\rho p$ = density of pigment (g/cm³).

The CPVC of a coating composition represents the densest packing of the pigment particles commensurate with the degree of dispersion of the system, which is that level of pigmentation in the dry composition where just sufficient binder is present to fill the voids between the pigment particles. The degree of pigment dispersion exerts a major influence on a CPVC value. A vehicle of high dispersive capacity, such as the linseed oil called for in the oil absorption test, will produce a substantially completely dispersed pigment state yielding a maximum CPVC value. On the other hand, a vehicle of lower dispersive capacity will give a reduced CPVC value in proportion to the flocculation that remains undispersed in the coating composition. See T. Patton, Paint Flow and Pigment Disperson, Chap. 7, pp. 184–187 (1966). The oil absorption of ZEEOSPHERES ® is approximately 9 for microsphere diameters of 0.1–5 microns and is lower for particle size distributions which include larger diameter microspheres (ASTMD281). The lower limit on the amount of ceramic microspheres present in the compositions is simply the minimum amount which will yield an image with good contrast at a given energy density at the surface of the composition. The radiant energy must be absorbed by the ceramic microspheres in order for an image to be produced. If the composition does not contain a sufficient amount of microspheres, the energy will pass through the composition without being absorbed.

The compositions of the present invention may contain barium sulfate in addition to the hollow, ceramic microspheres. Any barium sulfate or barytes can be employed in finely divided particulate form. The particle size of the barium sulfate has been found not to be important insofar as its ability to function in accordance with the present invention. The smaller the particle size, the more durable to abrasion the coating will be. With a smaller particle size, the coating will also be smoother and more aesthetically pleasing. The amount of barium sulfate included in the composition can likewise vary over a large range. Since radiation imageable compositions can be prepared using hollow, ceramic microspheres as the only filler material, only that amount of barium sulfate need be added which will improve the quality of the images produced.

The compositions of the present invention preferably contain both hollow, ceramic microspheres and barium sulfate. It has been observed that when only the microspheres were added, the images produced were not as bright as when both the microspheres and barium sulfate were included, and that when only barium sulfate was added, a higher energy level was required to produce images having the same degree of brightness and clarity as when both the microspheres and barium sulfate were used. Thus, the combination of both materials appears to provide superior image contrast and brightness to that obtained using either material alone. As with the use of microspheres alone, the upper limit on the amount of microspheres and barium sulfate in the composition must be below the CPVC, and the lower limit is the least amount which can be added and still produce the desired image quality. The volume of the hollow, ceramic microspheres and the particles of barium sulfate appears to be more important than the weight of the microspheres and particles. It has been found, for example, that if the compositions contain microspheres with large diameters, then more barium sulfate must be added to fill in the voids between the microspheres in order to obtain images of good quality. Similarly, if the compositions contain a smaller quantity of microspheres, then more barium sulfate must be added to obtain good image quality.

Although the amount of the hollow ceramic microspheres and the particles of barium sulfate by volume appears to be a more important consideration than the amount by weight, it has been found that the compositions which produce images with good contrast and brightness generally comprise up to about 65 percent by weight, and preferably from about 20 to about 45 percent by weight, of the hollow ceramic microspheres. Generally, the compositions further comprise up to about 65 percent by weight of barium sulfate. Preferably, the compositions comprise from about 20 to about 45 percent by weight of the microspheres together with from about 0.1 to about 15 percent by weight of barium sulfate.

The compositions further comprise a binder material for the hollow, ceramic microspheres and the barium sulfate. Since the imageable compositions of the present invention can be used in a variety of ways to prepare articles or surfaces of articles that can be imaged by exposure to intense radiation, the composition of the binder is primarily a function of the end use of the imageable composition. If the imageable composition is to be employed as a coating for electronic components, then any conventional coating composition can be used as the binder, provided it exhibits the other characteristics of the binder compositions described herein. Similarly, if the imageable composition is to be used as a potting compound or molding compound, then a conventional potting compound or molding compound can be used as the binder for the hollow, ceramic microspheres and barium sulfate.

In order for an image with good contrast to be produced in the composition of the present invention, the binder material should have an index of refraction greater than the index of refraction of the hollow ceramic microspheres or of the barium sulfate. If the index of refraction of the binder is less than that of the hollow microspheres or of the barium sulfate, then these materials will act as pigments to render the composition opaque upon drying or curing. If the microspheres and barium sulfate act as pigments for the binder, then an image will not be produced upon exposure to intense radiation. This is an especially important aspect of the present invention, since hollow, ceramic microspheres and barium sulfate are specifically employed as extender pigments. Because of their hollow, spherical structure, ceramic microspheres diffuse and scatter light resulting in a greater level of hiding power as a pigment. However, the hollow ceramic microspheres cannot act as pigments with any degree of hiding power if they are to function in accordance with the present invention.

It is important that the binder composition not contain any ingredient that will mask the image produced upon exposure to radiation. The principal ingredient used to bind the hollow ceramic microspheres and the particles of barium sulfate can be any of the natural or synthetic resins or polymers used to prepare coating, molding, potting or other compositions, such as acrylics, epoxies, phenolics, urea-formaldehydes, polyesters, varnishes, lacquers, shellacs, elastomers, and other resinous materials. Since the hollow, ceramic microspheres and the barium sulfate are the ingredients that are common to all of the present compositions, regardless of their particular end use, the binder can be any material that will hold the microspheres and the particles of barium sulfate together sufficiently to form a surface in which an image can be formed. A dye or pigment can be added to the binder composition to produce an article or coating of a desired color, provided that the binder composition in the absence of the dye or pigment has an index or refraction greater than that of the microspheres or the barium sulfate. If the binder composition contains too large an amount of the pigment or dye, however, the image produced upon irradiation of the composition will simply be masked by the color of the pigment or dye, provided that the dye or pigment is not itself destroyed by the radiation.

The binder compositions can also contain any of the conventional additives and modifiers which are generally included in such compositions, such as plasticizers, lubricants, adhesion promoters, flow modifiers, initiators, fungicides, curing agents and the like, depending upon the particular end use of each.

The compositions of the present invention can be employed to provide surfaces upon which images can be produced with high intensity radiant energy. Because many different types of binders can be used to prepare the present compositions, these compositions can be tailored to many widely differing applications. For example, laser marking systems are presently used to produce images on electronic components by subjecting a component coated with a composition containing a laser radiation absorbing material to an imagewise pattern of laser radiation. The coating is removed from the component in the areas subjected to radiation. As discussed above, however, the inability to provide coating compositions that match the colors of the potting compounds for the electronic components and provide sufficient image contrast upon irradiation has severely limited the acceptability of such laser marking systems.

In a preferred embodiment of the present invention, the composition is substantially transparent or translucent and changes color to white upon exposure to intense radiation. As noted above, such a composition is prepared by employing a binder material having an index of refraction greater than the index of refraction of either the hollow, ceramic microspheres or the barium sulfate. The microspheres are light gray in color. The barium sulfate in its finely divided form is white in color. Upon mixture of the microspheres and barium sulfate with a binder material such as a resin having a greater index of refraction, as opalescent material is obtained which cures or dries to a substantially transparent or translucent material. The compositions should not contain any ingredient that would increase the opacity of the composition.

The advantages of such transparent or translucent compositions are manifest. For example, the current problems associated with the use of laser systems for marking electronic components, such as DIPs, are alleviated by such compositions. Since substantially transparent coating compositions can be prepared, there is no longer any need to select dyes or pigments that match the color of the coating to the color of the potting compound of the electronic component and that change color or are destroyed to provide images of sufficient contrast. The white-colored image produced on the transparent coating will provide sufficient contrast against any darker color of the component over which it is coated. Thus, by coating the potting compound that encapsulates the electronic component with a substantially transparent coating that turns white upon exposure to intense radiation, the manufacturer will always maintain the desired color of the potting compound and will obtain sufficient contrast between the image and the background against which it is produced.

As an alternative, the manufacturer of the electronic components could prepare a potting compound containing hollow, ceramic microspheres and barium sulfate in accordance with the present invention. By using an essentially standard potting compound as all or part of the binder for the microspheres and barium sulfate, the manufacturer would entirely eliminate the need for a coating on the electronic components to provide an imageable surface, since the image could then be produced directly on the surface of the potting compound.

Since images are only produced in the areas of a surface having the composition of the present invention which are exposed to the intense radiation, it is immaterial whether the article is entirely made from the present composition or whether it is simply coated with the composition to render its surface imageable. Thus, it can be seen that many articles and surfaces can easily be rendered imageable. If an article is normally made from a composition that contains an inert extender or filler material, then all or part of the extender or filler material can be replaced with hollow, ceramic microspheres and barium sulfate in accordance with the present invention to render the surfaces of the article imageable. However, if the article is not usually made from a composition that contains a filler material, then the article can be coated with a coating composition containing the microspheres and barium sulfate in accordance with the present invention to render the coated surfaces of the article imageable upon exposure to intense radiation.

As a result, a wide variety of different articles can be rendered imageable. For example, articles which are made from natural or synthetic resins, such as molded or extruded articles, films, coating compositions, such as paints and inks, and potting compounds can be prepared in accordance with the present invention.

The advantages of such radiation imageable transparent or translucent compositions containing hollow, ceramic microspheres, and optionally barium sulfate, compared to coating compositions that are removed by laser radiation or that change color upon exposure to laser radiation which are discussed above, can also be obtained using similar transparent or translucent compositions containing clay and/or barium sulfate. However, the compositions of the present invention containing hollow, ceramic microspheres and barium sulfate exhibit a number of other advantages over the compositions that contain clay and/or barium sulfate. The coating compositions containing high loadings of clay and/or barium sulfate tend to be very viscous and difficult to handle and coat onto surfaces, such as electronic components. The uniformly-shaped hollow ceramic microspheres have a lower vehicle demand which results in a much lower viscosity and improved handling and coating characteristics. Compositions containing the hollow, ceramic microspheres are much easier, and therefore, less expensive to prepare than those containing clay and/or barium sulfate. Because the particles of clay and barium sulfate are irregular in size and shape, the surfaces of coatings made from compositions containing such particles are rough or coarse in character and appearance. Coatings made from such compositions having rough surface characteristics are relatively less abrasion resistant. By contrast, coatings made from compositions of the present invention containing uniformly-shaped spherical particles are very smooth in character and appearance, and consequently, are much more abrasion resistant. Moreover, the images produced in compositions of the present invention upon exposure to intense radiation have been observed to be brighter than or equal to the images produced in compositions containing clay and/or barium sulfate.

In accordance with the process of the present invention, an image can be produced on a substrate by providing the substrate with a surface made of the composition of the present invention. Since the image is to be formed in the surface of the substrate, only the surface need be made of the present composition, although the entire substrate could be made of the composition.

The surface of the substrate to be imaged is then subjected to a source of intense radiant energy. Suitable sources of intense radiation include lasers, gas discharge lamps, such as xenon flash lamps, and the like. A pulsed TEA $CO_2$ laser with a wavelength of 10.6 microns, an inherent raw beam energy of 0.7 joule/$cm^2$, and a pulse duration of 100 nanoseconds, operated at 28–32 KV and optically focused at a reduction of between 2.0:1 and 2.5:1, has been found to be particularly suitable. The surface of the substrate should be exposed to a source of radiation having a sufficient energy density for a period of time sufficient to produce an image in the areas exposed to the intense radiation. An energy density of from about 1.08 to about 8.4 joules/$cm^2$ has been found to be suitable.

The substrate typically is exposed to the source of radiation in the pattern of the image to be produced in the surface. Only those areas of the substrate on which an image is desired are subjected to the radiation. This imagewise exposure can be achieved, for example, using a mask, stencil, or other similar means for producing a pattern.

Upon exposure of the substrate to the imagewise pattern of intense radiation, the surface of the substrate changes color in the areas exposed to produce the desired image. If the binder material for the hollow, ceramic microspheres and barium sulfate is substantially transparent and colorless, then the image produced will appear white by contrast. If, however, the binder is made of a material that changes color or contains a dye or pigment which wholly or partially masks the image, then the image will appear as white or as a lighter shade of the color of the binder in contrast to a dark background, due to the underlying white image. For example, if the hollow, ceramic microspheres and barium sulfate were in an acrylic binder material, a clear colorless coating would be produced. If this material were coated onto a black article and then the coating were exposed to intense radiation, a white image would be produced against a black background. If, instead, a phenolic binder material were employed, a clear colorless coating would be obtained that would become yellow upon exposure to the radiation because the phenolic material exposed would change color from clear to yellow, thereby rendering the otherwise white image yellow in color. The phenolic coating that was not exposed to the radiation would remain clear so that the image would appear yellow against the black background.

If the contrast of the image produced is less than that desired, it can be improved by adjusting the amount of the hollow, ceramic microspheres and barium sulfate in the binder, the diameter of the hollow, ceramic microspheres, the energy density of the source of intense radiation, the duration of the exposure to the radiation, the thickness of the composition if employed as a coating, and the color of the binder material or of the background against which the image is produced.

A more complete appreciation of the present invention will be realized by reference to the following specific examples which relate to specific imageable compositions and to methods for preparing such compositions. Unless otherwise indicated, all references to percent or to parts of ingredients are to percent by weight and parts by weight of those ingredients. The following examples are not intended to limit the invention disclosed herein except to the extent that limitations are specifically stated or to the extent that limitations appear in the appended claims. It will be apparent to those skilled in the art that modifications or substitutions can be made to the present invention, such as those suggested in the foregoing detailed description without departing from the spirit and scope of the invention.

EXAMPLE 1

A U.V. curable coating composition was prepared by mixing the following components together in a three-roll mill:

| Parts | Component | Percent |
|-------|-----------|---------|
| 50.0 | ceramic microspheres (Zeeospheres ® 0.1–8 microns) | 40.6 |
| 16.2 | novolac epichorohydrin phenol formaldehyde epoxy resin | 13.1 |
| 32.4 | cycloaliphatic epoxy resin | 26.3 |
| 10.7 | bisphenol A glycidyl ether epoxy resin | 8.7 |
| 7.4 | U.V. activated epoxy curative | 6.0 |
| 2.8 | adhesion promoter | 2.3 |
| 1.8 | U.V. fluorescing whitener | 1.5 |
| 1.8 | wax | 1.5 |

The composition was mixed by passing it three times through the mill, achieving a viscosity of 12,000 cp at 76° F. (24° C.).

The composition was then coated onto the surface of an electronic component potting compound to a thickness of 15 to 20 microns using a Markem Model 8501 body coating apparatus set at a rate of 40 ft/min. The coated electronic component was then conveyed under a 1500 Watt ultraviolet lamp fixed at a distance of 2.5 inches above the component for a distance of 7.5 inches and at the rate of 40 ft/min. The cured composition was essentially transparent.

The coated potting compound was then exposed to an imagewise pattern of laser radiation. The beam of a pulsed TEA $CO_2$ laser at 29 KV was attenuated by a calcium fluoride disk and then passed through a metal imaging stencil for an energy density of 2.25 to 4.0 joules/$cm^2$ at the surface of the coating. A very good white image was produced in the coating.

The imaged coating was then subjected to a series of tests for chemical and abrasion resistance.

The coating was first subjected to the fingernail test in which the portion of the coating having the image is abraded with the edge of the fingernail of the person conducting the test. The coating is considered to have passed this test when the image remains legible after being abraded. If the coating is marred or scraped off so that the image is at least partially obliterated, then the coating is considered to have failed the test. The imaged coating prepared in this example passed the fingernail test.

The coating was then subjected to the Scotch ® tape test in which a strip of Scotch ® Brand 810 Magic Transparent Tape manufactured by 3M or any equivalent adhesive tape is firmly adhered to the surfacce of the imaged coating by rubbing and then immediately and rapidly stripped at an included angle (tape to tape) of less than 90°. If any major amount of the coating is removed so that the image is illegible, the coating is considered to have failed the test. The imaged coating prepared in this example twice failed the Scotch ® tape test. It was discovered after completion of the testing that the substrate surface was contaminated. This contamination caused the coating to fail the Scotch ® tape test.

The imaged coating was then subjected to a series of tests for resistance to solvents. In acordance with MIL-STD-883B (31 August 1977), Method 2015.3 (Nov. 4, 1980), the imaged coatings on electronic components are subjected to four solvents considered typical and representative of the desired stringency as far as the usual coatings and markings are concerned to verify that the markings (images) will not become illegible. The solvents will not cause deleterious, mechanical or electrical damage, or deterioration of the materials or finishes. The four solvent solutions used in the test are:

a. a mixture consisting of the following:
 1. one part by volume of isopropyl alcohol, A.C.S. (American Chemical Society) Reagent Grade, or isopropyl alcohol per TT-I-735, grade A or B, and
 2. three parts by volume of mineral spirits per TT-T-291, type II, grade A, or three parts by volume of a mixture of 80 percent by volume of kerosene and 20 percent by volume of ethylbenzene.
b. 1-1-1 Trichloroethane
c. azeotrope (Freon TMC 1/) or a mixture of 50.5±0.5 percent by weight (five parts by volume) of trichlorotrifluoroethane (Freon TF 1/) and 49.5±0.5 percent by weight (six parts by volume) of A.C.S. Reagent Grade methylene chloride
d. at 63° to 70° C., a mixture consisting of the following:
 1. 42 parts by volume of deionized water
 2. 1 part by volume of butyl cellosolve
 3. 1 part by volume of monoethanolamine The butyl cellosolve should be mixed thoroughly with water prior to adding the monoethanolamine.

The solvent solutions a, b and c are maintained at a temperature of 25°±5° C. and solution d is maintained at a temperature of 63° C. to 70° C.

Each of the four solvent solutions is placed in a vessel made of an inert material. The specimen to be tested is completely immersed in the solution in one of the vessels together with a brush for 1 minute. The brush is a toothbrush with a handle made of a nonreactive material and having three long rows of hard bristles, the free ends of which lie substantially in the same horizontal plane. A toothbrush is used exclusively with a single solvent and when there is any evidence of softening, bending, wear or loss of bristles, it is discarded.

Immediately following emersion, the specimen is brushed with normal hand pressure for 10 strokes on the portion of the coating having the image. Immediately after brushing, the above procedure is repeated two additional times, for a total of three immersions followed by brushings. The brush stroke is directed in a forward direction, across the surface of the specimen being tested. After completion of the third immersion and brushings, the specimens are rinsed and all surfaces are air blown dry. Each specimen is tested in only one of the solvent solutions.

After 5 minutes, the specimens are examined to determine the extent, if any, of deterioration that was incurred. Evidence of damage to the specimen and any specified images which are missing in whole or in part, faded, smeared, blurred, or shifted (dislodged) to the extent that they cannot be readily identified from a distance of at least 6 inches with normal room lighting and without the aid of magnification or with a viewer having a magnification no greater than 3X constitutes a failure.

The imaged coating prepared above passed the test when subjected to solvent solution d.

EXAMPLE 2

A U.V. curable coating composition was prepared by passing a mixture of the same amounts of the components set forth in Example 1 above three times through a three-roll mill, achieving a viscosity of 14,000 cp at 73° F. (23° C.).

The composition was coated onto the surface of a potting compound. Because the composition was not very tacky, it was found to be difficult to obtain even a thickness of 11 to 16 microns at a rate of 40 ft/min.

The coating was then cured under a U.V. lamp and the coated potting compound was then exposed to an imagewise pattern of laser radiation as in Example 1 above. A very good white image was produced in the essentially transparent cured coating.

The cured coating was then subjected to the fingernail, Scotch ® tape, and MIL-STD-883B, Method 2015.3 (solvent d) tests described above and passed all of them.

EXAMPLE 3

Following the procedure of Example 1 above, a U.V. curable coating composition was prepared by passing a mixture of the following components three times through a three-roll mill:

| Parts | Component | Percent |
|---|---|---|
| 50.0 | ceramic microspheres (Zeeospheres ® 0.1–45 microns) | 39.0 |
| 1.0 | barium sulfate (barytes) | 0.8 |
| 4.0 | water-washed kaolin clay (ASP ® 170, Engelhard Minerals & Chemicals Corp.) | 3.1 |
| 16.2 | novolac epichlorohydrin phenol formaldehyde epoxy resin | 12.6 |
| 32.4 | cycloaliphatic epoxy resin | 25.3 |
| 10.7 | bisphenol A glycidyl ether epoxy resin | 8.4 |
| 7.4 | U.V. activated epoxy curative | 5.8 |
| 2.8 | adhesion promoter | 2.2 |
| 1.8 | U.V. fluorescing whitener | 1.4 |
| 1.8 | wax | 1.4 |

The resulting composition had a viscosity of 48,000 cp at 65° F. (18° C.).

The composition was coated onto an electronic component potting compound to a thickness of 15 to 20 microns and cured by exposure to a 1500 Watt U.V. lamp fixed at a distance of 2.5 inches above the component for a distance of 7.5 inches at a rate of 40 ft/min. The cured coating composition was essentially transparent.

The coated potting compound was then exposed to an imagewise pattern of laser radiation as described in Example 1 above. A bright white image was produced in the coating.

The imaged coating was then subjected to a series of tests for chemical and abrasion resistance. The coating just barely failed the Scotch ® tape test, but passed the fingernail and the MIL-STD-883B, Method 2015.3 (solvents a, b, c and d) tests. It was discovered after completion of the testing that the substrate surface was contaminated. This contamination caused the coating to fail the Scotch ® tape test.

EXAMPLE 4

Following the procedure of Example 1 above, a U.V. curable coating composition was prepared by passing a mixture of the following components three times through a three-roll mill:

| Parts | Component | Percent |
|---|---|---|
| 50.0 | ceramic microspheres (Zeeospheres ® 0.1–45 microns) | 39.0 |
| 5.0 | barium sulfate (barytes) | 3.9 |
| 16.2 | novolac epichlorohydrin phenol formaldehyde epoxy resin | 12.6 |
| 32.4 | cycloaliphatic epoxy resin | 25.3 |
| 10.7 | bisphenol A glycidyl ether epoxy resin | 8.4 |
| 7.4 | U.V. activated epoxy curative | 5.8 |
| 2.8 | adhesion promoter | 2.2 |
| 1.8 | U.V. fluorescing whitener | 1.4 |
| 1.8 | wax | 1.4 |

The resulting composition had a viscosity of 38,000 cp at 64° F. (18° C.).

The composition was coated onto an electronic component potting compound to a thickness of 15 to 20 microns and then cured by exposure to U.V. radiation as described in Example 1 above. The cured composition was essentially transparent.

The coated potting compound was then exposed to an imagewise pattern of laser radiation as described in Example 3 above. A bright white image was produced in the coating composition.

The imaged coating failed the Scotch ® tape test, but passed the fingernail and the MIL-STD-883B, Method 2015.3 (solvents a, b, c and d) tests. It was discovered after completion of the testing that the substrate surface was contaminated. This contamination caused the coating to fail the Scotch ® tape test.

EXAMPLE 5

Following the proceure of Example 3 above, a U.V. curable coating composition was prepared by passing three times through a three-roll mill a mixture of the same amounts of the components set forth in Example 4 above, with the exception that ceramic microspheres having diameters in the range of 0.1–8 microns were substituted for those having diameters in the range of 0.1–45 microns. The resulting mixture had a viscosity of 40,000 cp at 64° F. (18° C.).

The composition was coated onto a potting compound to a thickness of 15 to 20 microns and then cured by exposure to U.V. radiation as described in Example 3 above. The cured composition was essentially transparent.

The coated potting compound was then exposed to an imagewise pattern of laser radiation as described in Example 3 above to produce a clear bright white image in the coating composition.

The imaged coating passed the Scotch ® tape, the fingernail, and the MIL-STD-883B, Method 2015.3 (solvents a, b, c and d) tests.

This coating appeared to be the smoothest of the three coatings produced in Examples 3–5.

EXAMPLE 6

Following the procedure of Example 1 above, a black, U.V. curable coating composition was prepared by passing a mixture of the following components three times through a three-roll mill:

| Parts | Component | Percent |
|---|---|---|
| 50.0 | ceramic microspheres (Zeeospheres ® 0.1–8 microns) | 39.1 |
| 10.0 | barium sulfate (barytes) | 7.8 |
| 7.0 | mineral black containing a small amount of a carbon black mordanted onto clay | 5.5 |
| 13.5 | novolac epichlorohydrin phenol formaldehyde epoxy resin | 10.6 |
| 27.0 | cycloaliphatic epoxy resin | 21.1 |
| 9.0 | bisphenol A glycidyl ether epoxy resin | 7.0 |
| 6.2 | U.V. activated epoxy curative | 4.8 |
| 2.2 | adhesion promoter | 1.7 |
| 1.5 | U.V. fluorescing whitener | 1.2 |
| 1.5 | wax | 1.2 |

The resulting composition had a viscosity of 38,000 cp at 73° F. (23° C.).

The composition was coated onto an electronic component potting compound to a thickness of 15 to 20 microns and then cured by exposure to U.V. radiation as described in Example 1 above.

The coated potting compound was then exposed to an imagewise pattern of laser radiation as described in Example 1 above. A gray image was produced in the black coating composition, because the mineral black in the composition partially masked the image.

The imaged coating failed the fingernail test and the Scotch ® tape test, but passed the MIL-STD-883B, Method 2015.3 (solvent d) test. It is believed that the coating failed the fingernail test because it was too brittle.

EXAMPLE 7

Following the procedure of Example 1 above, a black, U.V. curable coating composition was prepared by passing a mixture of the following components three times through a three roll-mil:

| Parts | Component | Percent |
|---|---|---|
| 50.0 | ceramic microspheres (Zeeospheres ® 0.1–8 microns) | 38.2 |
| 10.0 | barium sulfate (barytes) | 7.6 |
| 10.0 | graphite (Micro #150, Asbury Graphite Mills) | 7.6 |
| 13.5 | novolac epichlorohydrin phenol formaldehyde epoxy resin | 10.3 |
| 27.0 | cycloaliphatic epoxy resin | 20.6 |
| 9.0 | bisphenol A glycidyl ether epoxy resin | 6.9 |
| 6.2 | U.V. activated epoxy curative | 4.7 |
| 2.2 | adhesion promoter | 1.7 |
| 1.5 | U.V. fluorescing whitener | 1.2 |

| Parts | Component | Percent |
|---|---|---|
| 1.5 | wax | 1.2 |

The resulting composition had a viscosity of 116,000 cp at 73° F. (23° C.).

The composition was coated onto a potting compound to a thickness of 15 to 20 microns and then cured by exposure to U.V. radiation as described in Example 1 above.

The coated potting compound was then exposed to an imagewise pattern of laser radiation as described in Example 6 above. The image produced was very weak and just barely visible, because the graphite in the composition partially masked the image.

The imaged coating failed the fingernail test and was marginal in the Scotch ® tape test in which the coating came off in very small spots, but passed the MIL-STD-883B, Method 2015.3 (solvent d) test. It is believed that the coating failed the fingernail test because it was too brittle.

EXAMPLE 8

Following the procedure of Example 1 above, a U.V. curable coating composition was prepared by passing a mixture of the following components three times through a three-roll mill:

| Parts | Component | Percent |
|---|---|---|
| 75.0 | ceramic microspheres (Zeeospheres ® 0.1–45 microns) | 51.4 |
| 10.0 | barium sulfate (barytes) | 6.9 |
| 13.5 | novolac epichlorohydrin phenol formaldehyde epoxy resin | 9.3 |
| 27.0 | cycloaliphatic epoxy resin | 18.5 |
| 9.0 | bisphenol A glycidyl ether epoxy resin | 6.2 |
| 6.2 | U.V. activated epoxy curative | 4.2 |
| 2.2 | adhesion promoter | 1.5 |
| 1.5 | U.V. fluorescing whitener | 1.0 |
| 1.5 | wax | 1.0 |

The resulting composition had a viscosity of 64,000 cp at 75° F. (24° C.).

The composition was coated onto a potting compound to a thickness of 15 to 20 microns and then cured by exposure to U.V. radiation as described in Example 1 above.

The coated potting compound was then exposed to an imagewise pattern of laser radiation. The beam of a pulsed TEA $CO_2$ laser at 28.5 KV was attenuated with a calcium fluoride disk and then passed through a metal imaging stencil for an energy density of 3.0 to 3.25 joules/cm$^2$ at the surface of the coating. The images produced appeared more white than Example 4.

The imaged coating failed the fingernail test and passed the Scotch ® tape test and the MIL-STD-883B, Method 2015.3 (solvents a, b, c and d) tests. It is believed that the coating failed the fingernail test because it was too brittle.

EXAMPLES 9–14

Following the procedure of Example 1 above, three U.V. curable coating compositions were prepared by passing each of three different mixtures of the following components three times through a three-roll mill:

| Parts | Component | Percent |
|---|---|---|
| 50.0 | ceramic microspheres | 39.0 |
| 5.0 | barium sulfate (barytes) | 3.9 |
| 16.2 | novolac epichlorohydrin phenol formaldehyde epoxy resin | 12.6 |
| 32.4 | cycloaliphatic epoxy resin | 25.3 |
| 10.7 | bisphenol A glycidyl ether epoxy resin | 8.4 |
| 7.4 | U.V. activated epoxy curative | 5.8 |
| 2.8 | adhesion promoter | 2.2 |
| 1.8 | U.V. fluorescing whitener | 1.4 |
| 1.8 | wax | 1.4 |

The three compositions were the same except for the type of ceramic microspheres added to each. In the first composition, Zeeospheres ® having diameters in the range of 0.1–12 microns were used. These microspheres were the darkest in appearance of the three types used. In the second composition, Zeeospheres ® having diameters in the range of 0.1–16 microns were used, and in the third composition, Zeeospheres ® having diameters in the range of 0.1–20 microns were used. The three compositions had viscosities of 20,000 cp, 20,000 cp, and 27,000 cp at 73° F. (23° C.), respectively.

Each of the three compositions was coated onto two sets of surfaces of potting compounds of electronic components to thicknesses of 15 to 20 microns and 19 to 24 microns, respectively, and then cured by exposure to U.V. radiation as described in Example 1 above.

Each of coated potting compounds coated to two different thicknesses for each of the three coating compositions was then exposed to imagewise patterns of laser radiation. The beam of a pulsed TEA $CO_2$ laser with a 5:1 reduction was attenuated with two calcium fluoride disks and then passed through a metal imaging stencil for an energy density of 3.0 to 3.25 joules/cm$^2$ at the surface of the coating. Clear bright white images were produced in all of the thicker coatings. The images produced in all of the thinner coatings did not exhibit as much contrast. It is believed that the thinner coatings do not have a sufficient amount of microspheres and barium sulfate in the areas exposed to laser radiation, and therefore, allow too much of the laser radiation to pass through the coating without being absorbed.

All of the imaged coatings passed the fingernail, the Scotch ® tape, and the MIL-STD-883B, Method 2015.3 (solvents a, b, c and d) tests, although the 19 to 24 micron thick coatings using the third coating composition were marginal in the Scotch ® tape test.

EXAMPLE 15

Following the procedure of Example 1 above, a U.V. curable coating composition was prepared by passing a mixture of the following components three times through a three-roll mill:

| Parts | Component | Percent |
|---|---|---|
| 25.0 | ceramic microspheres (Zeeospheres ® 0.1–12 microns) | 24.3 |
| 5.0 | barium sulfate (barytes) | 4.9 |
| 16.2 | novolac epichlorohydrin phenol formaldehyde epoxy resin | 15.7 |
| 32.4 | cycloaliphatic epoxy resin | 31.4 |
| 10.7 | bisphenol A glycidyl ether epoxy resin | 10.4 |
| 7.4 | U.V. activated epoxy curative | 7.2 |
| 2.8 | adhesion promoter | 2.7 |

| -continued | | |
|---|---|---|
| Parts | Component | Percent |
| 1.8 | U.V. fluorescing whitener | 1.7 |
| 1.8 | wax | 1.7 |

The resulting composition had a viscosity of 10,000 cp at 73° F. The composition was coated onto the surface of electronic component potting compounds to a thickness of 19 to 24 microns using a laboratory body coater and then cured by exposure to U.V. radiation as described in Example 1 above.

The coated potting compound was then exposed to an imagewise pattern of laser radiation as described in Example 1. A sharp white image was produced in the coating.

When rubbed with isopropyl alcohol or a mixture of isopropyl alcohol and ethyl acetate, the coatings were removed. The coatings were not removed when rubbed with a bare hand. The surfaces of these electronic components were later found to be contaminated with Carnauba wax mold release causing the loss of adhesion.

The imaged coating passed the fingernail test, the Scotch ® tape test, and the MIL-STD-883B, Method 2015.3 (solvents a, b, c and d) tests.

EXAMPLE 16

Following the procedure of Example 1 above, a U.V. curable coating composition was prepared by passing a mixture of the following components three times through a three-roll mill:

| Parts | Component | Percent |
|---|---|---|
| 25.0 | ceramic microspheres (Zeeospheres ® 0.1–12 microns) | 25.5 |
| 16.2 | novolac epichlorohydrin phenol formaldehyde epoxy resin | 16.5 |
| 32.4 | cycloaliphatic epoxy resin | 33.0 |
| 10.7 | bisphenol A glycidyl ether epoxy resin | 10.9 |
| 7.4 | U.V. activated epoxy curative | 7.6 |
| 2.8 | adhesion promoter | 2.9 |
| 1.8 | U.V. fluorescing whitener | 1.8 |
| 1.8 | wax | 1.8 |

The resulting composition had a viscosity of 10,000 cp at 73° F. (23° C.).

The composition was coated onto a potting compound to a thickness of 15 to 20 microns and then cured by exposure to U.V. radiation as described in Example 1 above.

The coated potting compound was then exposed to an imagewise pattern of laser radiation as described in Example 1 above with an energy density of 2.25 joules/cm$^2$.

All of the imaged coatings passed the fingernail, the Scotch ® tape, and the MIL-STD-883B, Method 2015.3 (solvents a, b, c and d) tests.

EXAMPLE 17

An epoxy resin premix was prepared by mixing about 45.6 parts of an epoxy solution containing about 54.2 percent of a bisphenol A glycidyl ether epoxy resin and about 45.8 percent of tributyl phosphate, about 43.1 parts of a solution containing about 60 percent of a cross-linking resin for the epoxy and about 40 percent of tributyl phosphate, about 6 parts of a solution containing about 80 percent of a heat activated curing agent for the epoxy and about 20 percent of tributyl phosphate, about 3.2 parts of a thixotropic bodying agent, about 1.4 parts of an adhesion promoter, and about 0.7 parts of a fungicide using a high speed disk disperser set at a disk tip speed of 600 ft/min.

A heat curable coating composition was then prepared by mixing 40 parts of the above premix with 20 parts of ceramic microspheres (Zeeospheres ® 0.1–12 microns) and 1 part of a U.V. fluorescing whitener. The mixture was then passed three times through a three-roll mill. The resulting coating composition comprised the following components:

| Component | Percent |
|---|---|
| ceramic microspheres | 32.8 |
| bisphenol A glycidyl ether epoxy resin | 16.2 |
| cross-linking resin for epoxy | 17.0 |
| heat activated epoxy curative | 3.1 |
| thixotropic bodying agent | 2.1 |
| adhesion promoter | 0.9 |
| fungicide | 0.5 |
| tributyl phosphate | 25.8 |
| U.V. fluorescing whitener | 1.6 |

The viscosity of the resulting composition was 112,000 cp at 83° F. (28° C.).

The composition was coated onto the surface of an electronic component silicon resin potting compound to a thickness of 15 to 20 microns using a Markem Model 8501 body coating apparatus. The composition did not wet the surface well, and therefore, a rough coating was produced. The coated potting compound was then exposed to I.R. radiation from a 10-inch lamp of 2000 Watt total energy at a rate of 5 ft/min for a cure time of 10 seconds. The cured coating comprised about 44 percent of the ceramic microspheres.

The coated potting compound was then exposed to an imagewise pattern of laser radiation as described in Example 1 above. The images produced in the coating composition did not exhibit enough contrast because of the irregular surface and thickness of the rough coating.

EXAMPLE 18

A heat curable coating composition was prepared by mixing 40 parts of the epoxy resin premix prepared in Example 17 above with 20 parts of ceramic microspheres (Zeeospheres ® 0.1–12 microns), 20 parts of barium sulfate, (barytes 329) and 1 part of a U.V. fluorescing whitener, and then passing the mixture three times through a three-roll mill. The resulting coating composition comprised the following components:

| Component | Percent |
|---|---|
| ceramic microspheres | 24.7 |
| barium sulfate | 24.7 |
| bisphenol A glycidyl ether epoxy resin | 12.2 |
| cross-linking resin for epoxy | 12.8 |
| heat activated epoxy curative | 2.4 |
| thixotropic bodying agent | 1.6 |
| adhesion promoter | 0.7 |
| fungicide | 0.3 |
| tributyl phosphate | 19.4 |
| U.V. fluorescing whitener | 1.2 |

The resulting composition had a viscosity of 130,000 cp at 85° F. (29° C.).

The composition was coated onto silicon resin potting compounds to a thickness of 15 to 20 microns and cured by exposure to I.R. radiation as described in Example 17 above. The composition did not wet the surfaces well, and therefore, rough coatings were produced. The cured coating comprised about 30.6 percent of the ceramic microspheres and about 30.6 percent of the barium sulfate.

The coated potting compounds were then exposed to an imagewise pattern of laser radiation as described in Example 17 above. The images produced in the coating compositions did not exhibit enough contrast because of the irregular surfaces and thicknesses of the rough coatings.

EXAMPLE 19

A heat curable coating composition was prepared by mixing 20 parts of the epoxy resin premix prepared in Example 17 above with 20 parts of a urea-formaldehyde resin, 20 parts of ceramic microspheres (Zeeospheres ® 0.1–12 microns) and 1 part of a U.V. fluorescing whitener, and then passing the mixture three times through a three-roll mill. The resulting coating composition comprised the following components:

| Component | Percent |
| --- | --- |
| ceramic microspheres | 32.8 |
| urea-formaldehyde resin | 32.8 |
| bisphenol A glycidyl ether epoxy resin | 8.1 |
| cross-linking resin for epoxy | 8.5 |
| heat activated epoxy curative | 1.6 |
| thixotropic bodying agent | 1.0 |
| adhesion promoter | 0.5 |
| fungicide | 0.2 |
| tributyl phosphate | 12.9 |
| U.V. fluorescing whitener | 1.6 |

The resulting composition had a viscosity of 62,000 cp at 81° F. (27° C.).

The composition was coated onto silicon resin potting compounds to a thickness of 15 to 20 microns and cured by exposure to I.R. radiation as described in Example 17 above. The composition did not wet the surfaces well, and therefore, rough coatings were produced. The cured coating composition comprised about 37.7 percent of the ceramic microspheres.

The coated potting compounds were then exposed to an imagewise pattern of laser radiation as described in Example 17 above. The images produced in the coatings did not exhibit enough contrast because of the irregular surfaces and thicknesses of the rough coatings.

EXAMPLE 20

A heat curable coating composition was prepared by mixing 20 parts of the epoxy resin premix prepared in Example 17 above with 20 parts of a urea-formaldehyde resin, 40 parts of ceramic microspheres (Zeeospheres ® 0.1–12 microns) and 1.5 parts of U.V. fluorescing whitener, and then passing the mixture three times through a three-roll mill. The resulting coating composition comprised the following components:

| Component | Percent |
| --- | --- |
| ceramic microspheres | 49.1 |
| urea-formaldehyde resin | 24.5 |
| bisphenol A glycidyl ether epoxy resin | 6.1 |
| cross-linking resin for epoxy | 6.4 |
| heat activated epoxy curative | 1.2 |
| thixotropic bodying agent | 0.8 |
| adhesion promoter | 0.3 |
| fungicide | 0.2 |
| tributyl phosphate | 9.6 |
| U.V. fluorescing whitener | 1.8 |

The resulting composition had a viscosity of 220,000 cp at 75° F. (24° C.).

The composition was then coated onto the silicon resin potting compounds of electronic components to a thickness at which no large lumps were visible. This coating, which was estimated to have a thickness of 25 to 30 microns, was first exposed to I.R. radiation as described in Example 17 above, but at 65 percent of full power in an attempt to smooth the film and then rerun at 85 percent of full power to cure the coating. The cured coating comprised about 54.3 percent of ceramic microspheres.

Another electronic component was coated four times with the composition. The first thin coating appeared to wet the surface better than those of Examples 17–19 above. Each of the wet coats which had a thickness of 8 to 10 microns was exposed to I.R. radiation at 65 percent of full power and then rerun at 85 percent of full power to smooth and cure the composition. This procedure resulted in a smooth, thick coating that produced good images when exposed to an imagewise pattern of laser radiation as described in Example 17.

The composition was then thinned to 78,000 cp at 74° F. and an electronic component was coated twice as described above. When exposed to an imagewise pattern of laser radiation, good images were produced in the resulting coating.

A good coating could not be produced with a single pass through the Model 8501 body coater.

EXAMPLE 21

A heat curable coating composition was prepared by mixing 40 parts of the epoxy resin premix prepared in Example 17 with 40 parts of ceramic microspheres (Zeeospheres ® 0.1–16 microns) and 1.5 parts of U.V. fluorescing whitener, and then passing the mixture three times through a three-roll mill. The resulting coating composition comprised the following components:

| Component | Percent |
| --- | --- |
| ceramic microspheres | 46.2 |
| bisphenol A glycidyl ether epoxy resin | 11.4 |
| cross-linking resin for epoxy | 12.0 |
| heat activated epoxy curative | 2.2 |
| thixotropic bodying agent | 1.5 |
| adhesion promoter | 0.7 |
| fungicide | 0.3 |
| tributyl phosphate | 24.0 |
| U.V. fluorescing whitener | 1.7 |

The resulting composition had a viscosity of 52,000 cp at 73° F.

The potting compounds of electronic components were then coated with a single heavy coat of the composition. Because the coat was too thick, the component had to be pulled through the body coating apparatus by hand. The components were then coated with two thinner coats and cured by exposure to I.R. radiation as described in Example 24 above. The cured coating composition comprised about 60.8 percent of the ceramic microspheres.

The coated potting compound was then exposed to an imagewise pattern of laser radiation as described in Example 1 above. At an energy density of 1.9 to 2.1 joules/cm$^2$ at the surface of the coating, images with poor contrast were produced, at a higher energy density up to 4.3 joules/cm$^2$, yellow images were produced, and at an energy density above 4.3 joules/cm$^2$, the coating was destroyed.

EXAMPLES 22-23

An epoxy molding compound was prepared by passing a mixture of the following components three times through a three-roll mill:

| Component | Percent |
| --- | --- |
| ceramic microspheres (Zeeospheres ® 0.1–16 microns) | 45.4 |
| barium sulfate (barytes) | 9.1 |
| bisphenol A glycidyl ether epoxy resin | 36.4 |
| epoxy catalyst | 9.1 |

A second epoxy molding compound was similarly prepared with the following components:

| Component | Percent |
| --- | --- |
| ceramic microspheres (Zeeospheres ® 0.1–16 microns) | 22.7 |
| barium sulfate (barytes) | 9.1 |
| bisphenol A glycidyl ether epoxy resin | 59.1 |
| epoxy catalyst | 9.1 |

Each of the resulting molding compounds was poured onto a glass slide and cured in a convection oven at 150° C. for 5 minutes.

The cured compounds were then exposed to an imagewise pattern of laser radiation as described in Example 1 above with an energy density of 2.0 joules/cm$^2$ at the surface of the compound. Sharp white images were produced in both molding compounds.

EXAMPLE 24

A phenolic coating composition was prepared by passing a mixture of the following components three times through a three-roll mill:

| Component | Percent |
| --- | --- |
| ceramic microspheres (Zeeospheres ® 0.1–16 microns) | 50.0 |
| barium sulfate (barytes) | 10.0 |
| phenolic resin | 19.9 |
| tributyl phosphate | 19.9 |
| fungicide | 0.2 |

The resulting composition was heavily coated onto a glass slide to a thickness of greater than 30 microns and then cured in a convection oven at 150° C. for 5 minutes. The cured coating composition comprised about 62.4 percent of the ceramic microspheres and about 12.5 percent of the barium sulfate.

The cured coating was then exposed to an imagewise pattern of laser radiation as described in Examples 22-23 above. Sharp, slightly amber images were produced in the coating composition.

EXAMPLE 25

Following the procedure of Example 1 above, a U.V. curable coating composition was prepared by passing a mixture of the following components three times through a three-roll mill:

| Component | Percent |
| --- | --- |
| ceramic microspheres (Zeeospheres ® 0.1–16 microns) | 58.3 |
| barium sulfate (barytes) | 8.3 |
| novolac epichlorohydrin phenol formaldehyde epoxy resin | 7.8 |
| cycloaliphatic epoxy resin | 15.5 |
| bisphenol A glycidyl ether epoxy resin | 5.2 |
| U.V. activated epoxy curative | 3.6 |
| adhesion promoter | 1.3 |

A thick coating of the composition was then coated onto two electronic component potting compounds by hand and then cured by conveying the coated components under a 1500 Watt ultraviolet lamp fixed at a distance of 2.25 inches above the component for a distance of 7.5 inches at the rate of 5 ft/min. Good coatings were produced from the cured composition.

Both of the coated potting compounds were then exposed to an imagewise pattern of laser radiation as described in Example 1 above with an energy density of 2.0 joules/cm$^2$ at the surface of one of the coatings and an energy density of 4.5 joules/cm$^2$ at the surface of the other coating. At 2.0 joules/cm$^2$, a good bright image was produced in the coating, and at 4.5 joules/cm$^2$, a sharp bright image was produced in the coating.

EXAMPLE 26

Following the procedure of Example 25 above, a U.V. curable coating composition was prepared by passing a mixture of the following components three times through a three-roll mill:

| Component | Percent |
| --- | --- |
| ceramic microspheres (Zeeospheres ® 0.1–16 microns) | 9.4 |
| barium sulfate (barytes) | 65.6 |
| novolac epichlorohydrin phenol formaldehyde epoxy resin | 5.8 |
| cycloaliphatic epoxy resin | 11.7 |
| bisphenol A glycidyl ether epoxy resin | 3.8 |
| U.V. activated epoxy curative | 2.7 |
| adhesion promoter | 1.0 |

Two electronic component potting compounds were coated with the resulting composition and the coatings were then cured as described in Example 25 above. Good coatings were produced from the cured composition.

The coated potting compounds were then exposed to an imagewise pattern of laser radiation as described in Example 25 above. At both energy densities of 2.0 joules/cm$^2$ and 4.5 joules/cm$^2$, bright sharp images were produced in the coatings.

EXAMPLE 27

Following the procedure of Example 25 above, a U.V. curable coating composition was prepared by passing a mixture of the following components three times through a three-roll mill:

| Component | Percent |
|---|---|
| ceramic microspheres (Zeeospheres ® 0.1–16 microns) | 10.0 |
| barium sulfate (barytes) | 10.0 |
| novolac epichorohydrin phenol formaldehyde epoxy resin | 18.7 |
| cycloaliphatic epoxy resin | 37.3 |
| bisphenol A glycidyl ether epoxy resin | 12.3 |
| U.V. activated epoxy curative | 8.5 |
| adhesion promoter | 3.2 |

Two electronic component potting compounds were coated with the resulting composition and the coatings were then cured as described in Example 25 above. The coatings produced from the cured composition were rough in appearance.

The coated potting compounds were then exposed to an imagewise pattern of laser radiation as described in Example 25 above. At an energy density of 2.0 joules/cm$^2$, a poor incomplete image was produced in the coating, and at an energy density of 4.5 joules/cm$^2$, a fair grayish incomplete image was produced in the coating. The quality of the images was adversely affected by the irregular surfaces and thicknesses of the rough coatings.

EXAMPLE 28

Following the procedure of Example 25 above, a U.V. curable coating composition was prepared by passing a mixture of the following components three times through a three-roll mill:

| Component | Percent |
|---|---|
| ceramic microspheres (Zeeospheres ® 0.1–16 microns) | 2.0 |
| barium sulfate (barytes) | 77.6 |
| novolac epichlorohydrin phenol formaldehyde epoxy resin | 4.8 |
| cycloaliphatic epoxy resin | 9.5 |
| bisphenol A glycidyl ether epoxy resin | 3.1 |
| U.V. activated epoxy curative | 2.2 |
| adhesion promoter | 0.8 |

Two electronic component potting compounds were coated with the resulting composition and the coatings were then cured as described in Example 25 above. The coatings produced from the cured composition were rough in appearance.

The coated potting compounds were then exposed to an imagewise pattern of laser radiation as described in Example 25 above. At an energy density of 2.0 joules/cm$^2$, an incomplete image was produced in the coating, and at an energy density of 4.5 joules/cm$^2$, a brownish image was produced in the coating. The quality of the images was adversely affected by the irregular surfaces and thicknesses of the rough coatings.

EXAMPLE 29

Following the procedure of Example 25 above, a U.V. curable coating composition was prepared by passing a mixture of the following components three times through a three-roll mill:

| Component | Percent |
|---|---|
| ceramic microspheres (Zeeospheres ® 0.1–16 microns) | 64.4 |
| barium sulfate (barytes) | 1.7 |
| novolac epichlorohydrin phenol formaldehyde epoxy resin | 7.9 |
| cycloaliphatic epoxy resin | 15.8 |
| bisphenol A glycidyl ether epoxy resin | 5.2 |
| U.V. activated epoxy curative | 3.6 |
| adhesion promoter | 1.4 |

Two electronic component potting compounds were coated with the resulting composition and the coatings were then cured as described in Example 25 above. The coatings produced from the cured composition were rough in appearance.

The coated potting compounds were then exposed to an imagewise pattern of laser radiation as described in Example 25 above. At both energy densities of 2.0 joules/cm$^2$ and 4.5 joules/cm$^2$, good grayish images were produced in the coating.

EXAMPLE 30

Following the procedure of Example 25 above, a U.V. curable coating composition was prepared by passing a mixture of the following components three times through a three-roll mill:

| Component | Percent |
|---|---|
| ceramic microspheres (Zeeospheres ® 0.1–16 microns) | 2.0 |
| barium sulfate (barytes) | 18.0 |
| novolac epicholrohydrin phenol formaldehyde epoxy resin | 18.7 |
| cycloaliphatic epoxy resin | 37.3 |
| bisphenol A glycidyl ether epoxy resin | 12.3 |
| U.V. activated epoxy curative | 8.5 |
| adhesion promoter | 3.2 |

Two electronic component potting compounds were coated with the resulting composition and the coatings were then cured as described in Example 25 above. The coatings produced from the cured composition were smooth and glassy.

The coated potting compounds were then exposed to an imagewise pattern of laser radiation as described in Example 25 above. At an energy density of 2.0 joules/cm$^2$, a faint image was produced in the coating, and at an energy density of 4.5 joules/cm$^2$, a good brownish image was produced in the coating.

EXAMPLE 31

Following the procedure of Example 25 above, a U.V. curable coating composition was prepared by passing a mixture of the following components three times through a three-roll mill:

| Component | Percent |
|---|---|
| ceramic microspheres | 18.0 |

| Component | Percent |
| --- | --- |
| (Zeeospheres ® 0.1-16 microns) | |
| barium sulfate (barytes) | 2.0 |
| novolac epichlorohydrin phenol formaldehyde epoxy resin | 18.7 |
| cycloaliphatic epoxy resin | 37.3 |
| bisphenol A glycidyl ether epoxy resin | 12.3 |
| U.V. activated epoxy curative | 8.5 |
| adhesion promoter | 3.2 |

Two electronic component potting compounds were coated with the resulting composition and the coatings where then cured as described in Example 25 above. The coatings produced from the cured composition were smooth and glassy.

The coated potting compounds were then exposed to an imagewise pattern of laser radiation as described in Example 25 above. At both energy densities of 2.0 joules/cm$^2$ and 4.5 joules/cm$^2$, good grayish images were produced in the coatings.

EXAMPLE 32

Following the procedure of Example 1 above, a U.V. curable coating composition was prepared by passing a mixture of the following components three times through a three-roll mill:

| Component | Percent |
| --- | --- |
| ceramic microspheres (Zeeospheres ® 0.1-18 microns) | 4.6 |
| novolac epichlorohydrin phenol formaldehyde epoxy resin | 23.4 |
| cycloaliphatic epoxy resin | 46.9 |
| bisphenol A glycidyl ether epoxy resin | 15.5 |
| U.V. activated epoxy curative | 8.7 |
| adhesion promoter | 0.9 |

An electronic component potting compound was coated with the resulting composition to a thickness of 11 to 16 microns and the coating was cured by conveying the coated component under an ultraviolet lamp at a rate of 20 ft/min as described in Example 1 above. A good coating was produced from the cured composition. The coated potting compound was then exposed to an imagewise pattern of laser radiation as described in Example 1 above. The image produced in the coating composition was brownish and incomplete.

EXAMPLE 33

Following the procedure of Example 1 above, a U.V. curable coating composition was prepared by passing a mixture of the following components three times through a three-roll mill:

| Component | Percent |
| --- | --- |
| ceramic microspheres (Zeeospheres ® 0.1-18 microns) | 4.6 |
| barium sulfate (barytes) | 9.2 |
| novolac epichlorohydrin phenol formaldehyde epoxy resin | 21.2 |
| cycloaliphatic epoxy resin | 42.4 |
| bisphenol A glycidyl ether epoxy resin | 13.9 |
| U.V. activated epoxy curative | 7.8 |
| adhesion promoter | 0.9 |

An electronic component potting compound was coated with the resulting composition to a thickness of 11 to 16 microns and the coating was cured as described in Example 32 above. A good coating was produced from the cured composition.

The coated potting compound was then exposed to an imagewise pattern of laser radiation as described in Example 1 above. An incomplete, grayish image was produced in the coating composition.

EXAMPLE 34

Following the procedure of Example 1 above, a U.V. curable coating composition was prepared by passing a mixture of the following components three times through a three-roll mill:

| Component | Percent |
| --- | --- |
| ceramic microspheres (Zeeospheres ® 0.1-18 microns) | 6.9 |
| novolac epichlorohydrin phenol formaldehyde epoxy resin | 22.9 |
| cycloaliphatic epoxy resin | 45.7 |
| bisphenol A glycidyl ether epoxy resin | 15.1 |
| U.V. activated epoxy curative | 8.5 |
| adhesion promoter | 0.9 |

An electronic component potting compond was coated with the resulting composition to a thickness of 11 to 16 microns and the coating was cured as described in Example 32 above. A good coating was produced from the cured compositions.

The coated potting compound was then exposed to an imagewise pattern of laser radiation as described in Example 1 above. A slightly brownish image was produced in the coating composition.

EXAMPLE 35

Following the procedure of Example 1 above, a U.V. curable coating composition was prepared by passing a mixture of the following components three times through a three-roll mill:

| Component | Percent |
| --- | --- |
| ceramic microspheres (Zeeospheres ® 0.1-18 microns) | 7.0 |
| barium sulfate (barytes) | 9.3 |
| novolac epichlorohydrin phenol formaldehyde epoxy resin | 20.6 |
| cycloaliphatic epoxy resin | 41.1 |
| bisphenol A glycidyl ether epoxy resin | 13.6 |
| U.V. activated epoxy curative | 7.6 |
| adhesion promoter | 0.8 |

An electronic component potting compound was coated with the resulting composition to a thickness of 11 to 16 microns and the coating was cured as described in Example 32 above. A good coating was produced from the cured composition.

The coated potting compound was then exposed to an imagewise pattern of laser radiation as described in Example 1 above. An incomplete white image was produced in the coating composition.

A second potting compound was coated with the composition to a thickness of 35 to 40 microns and the coating was cured as described above. A good coating was produced from the cured composition.

The second coated potting compound was then exposed to an imagewise pattern of laser radiation as described above. A complete white image was produced in the coating composition.

EXAMPLE 36

Following the procedure of Example 1 above, a U.V. curable coating composition was prepared by passing a mixture of the following components three times through a three-roll mill:

| Component | Percent |
|---|---|
| ceramic microspheres (Zeeospheres ® 0.1-18 microns) | 2.0 |
| novolac epichlorohydrin phenol formaldehyde epoxy resin | 23.8 |
| cycloaliphatic epoxy resin | 47.7 |
| bisphenol A glycidyl ether epoxy resin | 15.7 |
| U.V. activated epoxy curative | 9.8 |
| adhesion promoter | 1.0 |

An electronic component potting compound was coated with the resulting composition to a thickness of 11 to 16 microns and the coating was cured as described in Example 32 above. A good coating was produced from the cured composition.

The coated potting compound was then exposed to an imagewise pattern of laser radiation as described in Example 1 above. A poor, incomplete image was produced in the coating composition.

EXAMPLE 37

Following the procedure of Example 1 above, a U.V. curable coating composition was prepared by passing a mixture of the following components three times through a three-roll mill:

| Component | Percent |
|---|---|
| ceramic microspheres (Zeeospheres ® 0.1-18 microns) | 2.0 |
| barium sulfate (barytes) | 9.9 |
| novolac epichlorohydrin phenol formaldehyde epoxy resin | 21.5 |
| cycloaliphatic epoxy resin | 42.9 |
| bisphenol A glycidyl ether epoxy resin | 14.1 |
| U.V. activated epoxy curative | 8.7 |
| adhesion promoter | 0.9 |

An electronic component potting compound was coated with the resulting composition to a thickness of 11 to 16 microns and the coating was cured as described in Example 32 above. A good coating was produced from the cured composition.

The coated potting compound was then exposed to an imagewise pattern of laser radiation as described in Example 1 above. A poor image was produced in the coating composition.

What is claimed is:

1. A radiation imageable composition in which an image can be produced upon exposure to intense radiation, said composition comprising
   (a) hollow, ceramic microspheres, and
   (b) a binder material which will not be destroyed during exposure of the composition to intense radiation and will not mask the image produced upon exposure to intense radiation, wherein the binder material has an index of refraction greater than the index of refraction of the microspheres in the absence of any other dye or pigment.

2. The composition of claim 1 wherein the microspheres are made of a silica-alumina alloy.

3. The composition of claim 2 wherein the microspheres have a diameter of up to about 300 microns.

4. The composition of claim 1 wherein the amount of microspheres is less than the critical pigment volume content of the composition.

5. The composition of claim 4 which comprises up to about 65 percent by weight of the microspheres.

6. The composition of claim 5 which comprises from about 20 to about 45 percent by weight of the microspheres.

7. The composition of claim 1 which further comprises barium sulfate.

8. The composition of claim 7 wherein the amount of microspheres and barium sulfate is less than the critical pigment volume content of the composition.

9. The composition of claim 8 which comprises up to about 65 percent by weight of barium sulfate.

10. The composition of claim 9 which comprises from about 20 to about 45 percent by weight of the microspheres and from about 0.1 to about 15 percent by weight of barium sulfate.

11. The composition of claim 1 or 7 wherein the composition is essentially transparent or translucent when dried or cured.

12. The composition of claim 11 wherein the image produced is white in color.

13. The composition of claim 1 wherein the binder material comprises a natural synthetic resin material.

14. The composition of claim 13 wherein the binder material comprises an epoxy resin.

15. The composition of claim 13 wherein the binder material comprises an acrylic resin.

16. The composition of claim 13 wherein the binder material comprises a urea-formaldehyde resin.

17. The composition of claim 13 wherein the binder material comprises a phenolic resin.

18. The composition of claim 17 wherein the image produced is yellow in color.

19. A process for producing an image on a substrate comprising
   (a) providing a substrate made of a radiation imageable composition in which an image can be produced upon exposure to intense radiation, said composition comprising
      (1) hollow, ceramic microspheres, and
      (2) a binder material which will not be destroyed during exposure of the composition to intense radiation and will not mask the image produced upon exposure to intense radiation, wherein the binder material has an index of refraction greater than the index of refraction of the microspheres in the absence of any other dye or pigment, and
   (b) exposing the surface of said substrate to a source of high intensity radiation having a sufficient energy density and for a period of time sufficient to produce an image in the areas exposed to intense radiation.

20. A process for producing an image on a substrate comprising
   (a) providing a substrate,
   (b) coating said substrate with a radiation imageable composition in which an image can be produced upon exposure to intense radiation, said composition comprising
(1) hollow, ceramic microspheres, and
(2) a binder material which will not be destroyed during exposure of the composition to intense radiation and will not mask the image produced upon exposure to intense radiation, wherein the binder material has an index of refraction greater than the index of refraction of the microspheres in the absence of any other dye or pigment, and
(c) exposing the surface of said coating to a source of high intensity radiation having a sufficient energy density for a period of time sufficient to produce an image in the areas exposed to the radiation.

21. The process of claim 19 or 20 wherein the source of radiation is a laser.

22. The process of claim 21 wherein said laser employs carbon dioxide gas as the active laser medium.

23. The process of claim 19 or 20 wherein the source of radiation is a gas discharge lamp.

24. The process of claim 23 wherein the gas discharge lamp is a xenon flash lamp.

25. The process of claim 19 or 20 wherein the energy density is in the range of about 1.08 to about 8.4 joules/cm$^2$.

26. The process of claim 19 or 20 wherein the microspheres are made of a silica-alumina alloy.

27. The process of claim 26 wherein the microspheres have a diameter up to about 300 microns.

28. The process of claim 19 or 20 wherein the radiation imageable composition is essentially transparent or translucent when dried or cured.

29. The process of claim 28 wherein the image produced is white in color.

30. The process of claim 19 or 20 wherein the binder material comprises a natural or synthetic resin material.

31. The process of claim 30 wherein the binder material comprises an epoxy resin.

32. The process of claim 30 wherein the binder material comprises an acrylic resin.

33. The process of claim 30 wherein the binder material comprises a urea-formaldehyde resin.

34. The process of claim 30 wherein the binder material comprises a phenolic resin.

35. The process of claim 34 wherein the image produced is yellow in color.

36. The process of claim 19 or 20 wherein the amount of microspheres in the radiation imageable composition is less than the critical pigment volume content of the composition.

37. The process of claim 36 wherein the radiation imageable composition comprises up to about 65 percent by weight of the microspheres.

38. The process of claim 37 wherein the radiation imageable composition comprises from about 20 to about 45 percent by weight of the microspheres.

39. The process of claim 19 or 20 wherein the radiation imageable composition further comprises barium sulfate.

40. The process of claim 39 wherein the amount of microspheres and barium sulfate in the radiation imageable composition is less than the critical pigment volume content of the composition.

41. The process of claim 40 wherein the radiation imageable composition comprises up to about 65 percent by weight of barium sulfate.

42. The process of claim 41 wherein the radiation imageable composition comprises from about 20 to about 45 percent by weight of the microspheres and from about 0.1 to about 15 percent by weight of barium sulfate.

43. The process of claim 39 wherein the radiation imageable composition is essentially transparent or translucent when dried or cured.

44. The process of claim 43 wherein the image produced is white in color.

45. A process for rendering a substrate imageable upon exposure to intense radiation which comprises making said substrate from a composition comprising
(a) hollow, ceramic microspheres, and
(b) a binder material which will not be destroyed during exposure to intense radiation and will not mask the image produced upon exposure to intense radiation, wherein the binder material has an index of refraction greater than the index of refraction of the microspheres in the absence of any other dye or pigment.

46. A process for rendering a substrate imageable upon exposure to intense radiation which comprises coating said substrate with a composition comprising
(a) hollow, ceramic microspheres, and
(b) a binder material which will not be destroyed during exposure to intense radiation and will not mask the image produced upon exposure to intense radiation, wherein the binder material has an index of refraction greater than the index of refraction of the microspheres in the absence of any other dye or pigment.

47. The process of claim 45 or 46 wherein the microspheres are made of a silica-alumina alloy.

48. The process of claim 47 wherein the microspheres have a diameter of up to about 300 microns.

49. The process of claim 45 or 46 wherein the composition is essentially transparent or translucent when dried or cured.

50. The process of claim 45 or 46 wherein the image produced is white in color.

51. The process of claim 45 or 46 wherein the binder material comprises a natural or synthetic resin material.

52. The process of claim 51 wherein the binder material comprises an epoxy resin.

53. The process of claim 51 wherein the binder material comprises an acrylic resin.

54. The process of claim 51 wherein the binder material comprises a urea-formaldehyde resin.

55. The process of claim 51 wherein the binder material comprises a phenolic resin.

56. The process of claim 55 wherein the image produced is yellow in color.

57. The process of claim 45 or 46 wherein the amount of microspheres in the radiation imageable composition is less than the critical pigment volume content of the composition.

58. The process of claim 57 wherein the composition comprises up to about 65 percent by weight of the microspheres.

59. The process of claim 58 wherein the composition comprises from about 20 to about 45 percent by weight of the microspheres.

60. The process of claim 45 or 46 wherein the composition further comprises barium sulfate.

61. The process of claim 60 wherein the amount of microspheres and barium sulfate in the radiation imageable composition is less than the critical pigment volume content of the composition.

62. The process of claim 61 wherein the composition comprises up to about 65 percent by weight of barium sulfate.

63. The process of claim 62 wherein the composition comprises from about 20 to about 45 percent by weight of the microspheres and from about 1 to about 15 percent by weight of barium sulfate.

64. The process of claim 60 wherein the composition is essentially transparent or translucent when dried or cured.

65. The process of claim 60 wherein the image produced is white in color.

* * * * *